US009818607B2

(12) United States Patent
Kwok et al.

(10) Patent No.: US 9,818,607 B2
(45) Date of Patent: Nov. 14, 2017

(54) METAL-INDUCED CRYSTALLIZATION OF AMORPHOUS SILICON IN AN OXIDIZING ATMOSPHERE

(71) Applicant: The Hong Kong University of Science and Technology, Hong Kong (CN)

(72) Inventors: Hoi Sing Kwok, New Territories (HK); Man Wong, New Territories (HK); Rongsheng Chen, Kowloon (HK); Meng Zhang, Kowloon (HK); Wei Zhou, Kowloon (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 36 days.

(21) Appl. No.: 14/745,752

(22) Filed: Jun. 22, 2015

(65) Prior Publication Data

US 2016/0020095 A1  Jan. 21, 2016

Related U.S. Application Data

(60) Provisional application No. 61/999,169, filed on Jul. 18, 2014.

(51) Int. Cl.
*H01L 29/04* (2006.01)
*H01L 21/02* (2006.01)
(Continued)

(52) U.S. Cl.
CPC .. *H01L 21/02672* (2013.01); *H01L 21/02532* (2013.01); *H01L 29/04* (2013.01);
(Continued)

(58) Field of Classification Search
CPC . H01L 21/02672; H01L 29/786; H01L 29/16; H01L 29/32; H01L 21/02422; H01L 21/02532; H01L 21/02592; H01L 29/04
See application file for complete search history.

(56) References Cited

U.S. PATENT DOCUMENTS 6,337,259 B1 * 1/2002 Ueda .................. H01L 21/3226
257/E21.32
6,465,287 B1 * 10/2002 Yamazaki ........... H01L 21/2022
257/E21.133
(Continued)

FOREIGN PATENT DOCUMENTS

CA 103311105 A 9/2013
JP 11-329972 * 11/1999
(Continued)

OTHER PUBLICATIONS

MTD—Yoshinouchi (1999).*
(Continued)

*Primary Examiner* — Ahmed Sefer
(74) *Attorney, Agent, or Firm* — Amin, Turocy & Watson, LLP

(57) ABSTRACT

Techniques are provided for forming thin film transistors having a polycrystalline silicon active layer formed by metal-induced crystallization (MIC) of amorphous silicon in an oxidizing atmosphere. In an aspect, a transistor device, is provided that includes a source region and a drain region formed on a substrate, and an active channel region formed on the substrate and electrically connecting the source region and the drain region. The active channel region is formed with a polycrystalline silicon layer having resulted from annealing an amorphous silicon layer formed on the substrate and having a metal layer formed thereon, wherein the annealing of the amorphous silicon layer was at least partially performed in an oxidizing ambience, thereby resulting in crystallization of the amorphous silicon layer to form the polycrystalline silicon layer.

34 Claims, 12 Drawing Sheets

(51) Int. Cl.
- *H01L 29/786* (2006.01)
- *H01L 29/16* (2006.01)
- *H01L 29/32* (2006.01)

(52) U.S. Cl.
CPC .............. *H01L 29/16* (2013.01); *H01L 29/32* (2013.01); *H01L 29/786* (2013.01); *H01L 21/02422* (2013.01); *H01L 21/02592* (2013.01)

(56) References Cited

U.S. PATENT DOCUMENTS

| | | | |
|---|---|---|---|
| 8,088,676 B2 | 1/2012 | Wong et al. | |
| 2006/0063315 A1* | 3/2006 | Shin | H01L 21/2022 438/166 |
| 2006/0263957 A1* | 11/2006 | Wong | H01L 21/02532 438/166 |
| 2010/0197102 A1* | 8/2010 | Akao | C23C 18/1212 438/303 |
| 2010/0219415 A1* | 9/2010 | Park | H01L 21/02488 257/72 |
| 2012/0049199 A1 | 3/2012 | Chung et al. | |
| 2012/0056187 A1* | 3/2012 | Park | H01L 21/0245 257/66 |

FOREIGN PATENT DOCUMENTS

| | | | |
|---|---|---|---|
| KR | 2007-71165 | * | 7/2007 |
| KR | 20090056542 A | | 6/2009 |
| TW | 200933753 A | | 8/2009 |

OTHER PUBLICATIONS

Chen, et al., "High Performance Polycrystalline Silicon Thin-Film Transistors Based on Metal-Induced Crystallization in an Oxidizing Atmosphere", IEEE Electron Device Letters, vol. 36, No. 5, 3 pages, Mar. 9, 2015.

Meng, et al. "High performance low temperature metal-induced unilaterally crystallized polycrystalline silicon thin film transistors for system-on-panel applications", IEEE Trans. Electron Devices, vol. 47, No. 2, pp. 404-409 2000.

N. Yamauchi and R. Reif "Polycrystalline silicon thin films processed with silicon ion implantation and subsequent solid-phase crystallization: Theory, experiments, and thin-film transistor applications", J. Appl. Phys., vol. 75, No. 7, pp. 3235-3257 1994.

S. Y. Yoon, et al. "Structural and electrical properties of polycrystalline silicon produced by low-temperature Ni silicide mediated crystallization of the amorphous phase", J. Appl. Phys., vol. 87, No. 1, pp. 609-611 2000.

T. Sameshima, S. Usui and M. Sekiya "XeCl excimer laser annealing used in the fabrication of poly-Si TFTs", IEEE Electron Device Lett., vol. 7, No. 5, pp. 276-278 1986.

W. Zhou "Bridged-grain solid-phase-crystallized polycrystalline-silicon thin-film transistors", IEEE Electron Device Lett. vol. 33, No. 10, pp. 1414-1416 2012.

M. Wang, Z. Meng and M. Wong "The effects of high temperature annealing on metal-induced laterally crystallized polycrystalline silicon", IEEE Trans. Electron Devices, vol. 47, No. 11, pp. 2061-2067 2000.

A. Yin and S. J. Fonash "Oxygen-plasma-enhanced crystallization of a-Si:H films on glass", J. Vac. Sci. Technol. A, vol. 12, No. 4, pp. 1237-1240 1994.

T. Kamiya "Reduction of grain-boundary potential barrier height in polycrystalline silicon with hot H2O-vapor annealing probed using point-contact devices", J. Vac. Sci. Technol. B, vol. 21, No. 3, pp. 1000-1003 2003.

R. E. Proano and D. G. Ast "Effects of the presence/absence of HCl during gate oxidation on the electrical and structural properties of polycrystalline silicon thin-film transistors", J. App. Phys., vol. 66, No. 5, pp. 2189-2199 1989.

S. M. Hu "Formation of stacking faults and enhanced diffusion in the oxidation of silicon", J. Appl. Phys., vol. 45, No. 4, pp. 1567-1573 1974.

D. Skarlatos "Estimation of the number of interstitial atoms injected in silicon during thin oxide formation", J. Electrochem. Soc., vol. 146, No. 6, pp. 2276-2283 1999.

Z. Jin "Nickel induced crystallization of amorphous silicon thin films", J. Appl. Phys., vol. 84, No. 1, pp. 194-200 1998.

I.-W. Wu "Passivation kinetics of two types of defects in polysilicon TFT by plasma hydrogenation", IEEE Electron Device Lett., vol. 12, No. 4, pp. 181-183 1991.

"What is LTPS?", AUO, http://www.auo.com/?sn=191&lang=en-US, last accessed Sep. 23, 2015.

"Low Temperature Polysilicon", Sharp, http://www.sharpmicro.com/Page.aspx./americas/en/efe83072-e454-4b44-bd61-710186dd09e8/Low_Temperature_Polysilicon/, last accessed Sep. 23, 2015.

"Color TFT Display Modules", Purdy Electronics, https://www.purdyelectronics.com/products/displays_tft_lcd_color, last accessed Sep. 23, 2015.

"Low-Temperature Polysilicon TFT LCD" Toshiba, http://www.toshiba.co.uk/innovation/jsp/news.do?service=UK&year=NONE&ID=00000005b3, last accessed Sep. 23, 2015.

"Deposition" Echerkon Technologies Ltd, http://www.echerkon.co.uk/products.html, last accessed Sep. 23, 2015.

"KYOCERA Introduces New Advanced TFT LCDs to the Automotive Market", Kyocera, http://www.kyocera-display.com/pdf/KyoceraIntroducesNewAdvancedLCDsToAutomotiveMarket2.pdf, last accessed Sep. 23, 2015.

* cited by examiner

TABLE 1

| Sample Label | Stage 1 N₂ annealing (Hrs) | Stage 2 O₂ annealing (Hrs) | Total Annealing Time (Hrs) |
|---|---|---|---|
| A | 10 | 0 | 10 |
| B | 0 | 10 | 10 |
| C | 2 | 8 | 10 |
| D | 1 | 9 | 10 |
| E | 0.5 | 9.5 | 10 |

FIG. 13

TABLE 2

| Sample Label | $V_{th}$ (V) | On-off ratio (x10$^6$) | Mobility (cm$^2$/Vs) |
|---|---|---|---|
| A | -6.3 | 2.70 | 32.8 |
| B | -6.0 | 3.62 | 42.1 |
| C | -7.00 | 4.87 | 35.5 |
| D | -5.8 | 3.69 | 49.7 |
| E | -5.1 | 6.67 | 48.8 |

METAL-INDUCED CRYSTALLIZATION OF AMORPHOUS SILICON IN AN OXIDIZING ATMOSPHERE

RELATED APPLICATION

This application claims priority to U.S. Provisional Patent Application No. 61/999,169 filed on Jul. 18, 2014, and entitled "METAL-INDUCED CRYSTALLIZATION OF AMORPHOUS SILICON IN AN OXIDIZING ATMOSPHERE." The entirety of the aforementioned application is incorporated by reference herein.

TECHNICAL FIELD

This disclosure relates generally to metal-induced crystallization (MIC) of amorphous silicon in an oxidizing atmosphere.

BACKGROUND

Amorphous silicon (a-Si) is a form of silicon that has no crystalline structure. A-Si is critical to producing thin film transistors (TFTs) because, due to its lack of crystal structure, it can be vapor-deposited onto large substrates. However, the elimination of the crystal structure significantly compromises the performance of a-Si as a TFT semiconductor material. Polycrystalline silicon or polysilicon (p-Si) is a material consisting of small silicon crystals. TFTs made with p-Si have a higher mobility than that of TFTs made with a-Si due to the crystalline structure of the p-Si. The higher mobility of p-Si TFTs provides a higher aperture ratio when used as switch transistors for display pixels. In addition, the higher mobility of p-Si TFTs offers the possibility of integrating peripheral driving circuits with the display pixel matrix, thus enabling a system on panel (SOP). Accordingly, p-Si TFTs are excellent candidates for the next generation flat-panel displays, particularly those based on organic light-emitting diodes. As users demand higher quality in flat-panel displays with larger viewing area and finer resolution, the p-Si TFT technology becomes increasingly important relative to the a-Si TFT technology currently employed in color active matrix liquid crystal displays.

The quality of the p-Si layer of a device employing p-Si TFTs is one of the key factors which determines the performance of the device. Much effort has been made to improve the quality of p-Si used in TFTs while balancing increased manufacturing costs relative to that of a-Si. P—Si can be directly deposited onto a TFT substrate by means of chemical vapor deposition (CVD). However, CVD deposition results in a high defect density, lowering the mobility of the p-Si. An alternative and preferred technique is to crystallize a-Si to form p-Si.

The three broad categories of a-Si crystallization methods include solid-phase crystallization (SPC), metal-induced crystallization (MIC) and excimer laser crystallization (ELC). The conventional SPC process is the simplest and most direct method to obtain p-Si. With SPC, after CVD deposition of a-Si onto a substrate, the substrate is heat-treated at a specific temperature for a specific duration to crystallize the a-Si. The MIC process involves usage of a metal catalyst to facilitate crystallization of a-Si during heat-treatment. MIC generally requires a shorter processing time and/or a lower processing temperature relative to that of SPC. ELC employs a laser as a local heat source to induce the crystallization a-Si. Although ELC has been determined to produce a higher quality p-Si relative to that of conventional SPC or MIC, ELC requires high cost equipment and provides a slower process throughput. In addition the p-Si produced with ELC has inferior uniformity relative to the p-Si produced using SPC or MIC. Accordingly, there is a strong business incentive to develop new MIC and/or SPC techniques that produce high quality p-Si while maintaining the low manufacturing cost afforded by MIC and SPC.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

FIG. 13 provides a table provides a table defining the various annealing durations and conditions of different p-Si active layers included in five different TFT devices A-E formed in accordance with aspects and embodiments described herein;

FIG. 18 provides a table summarizing the mean electrical properties of five different TFT devices A-E formed in accordance with aspects and embodiments described herein.

DETAILED DESCRIPTION

Figure 1:
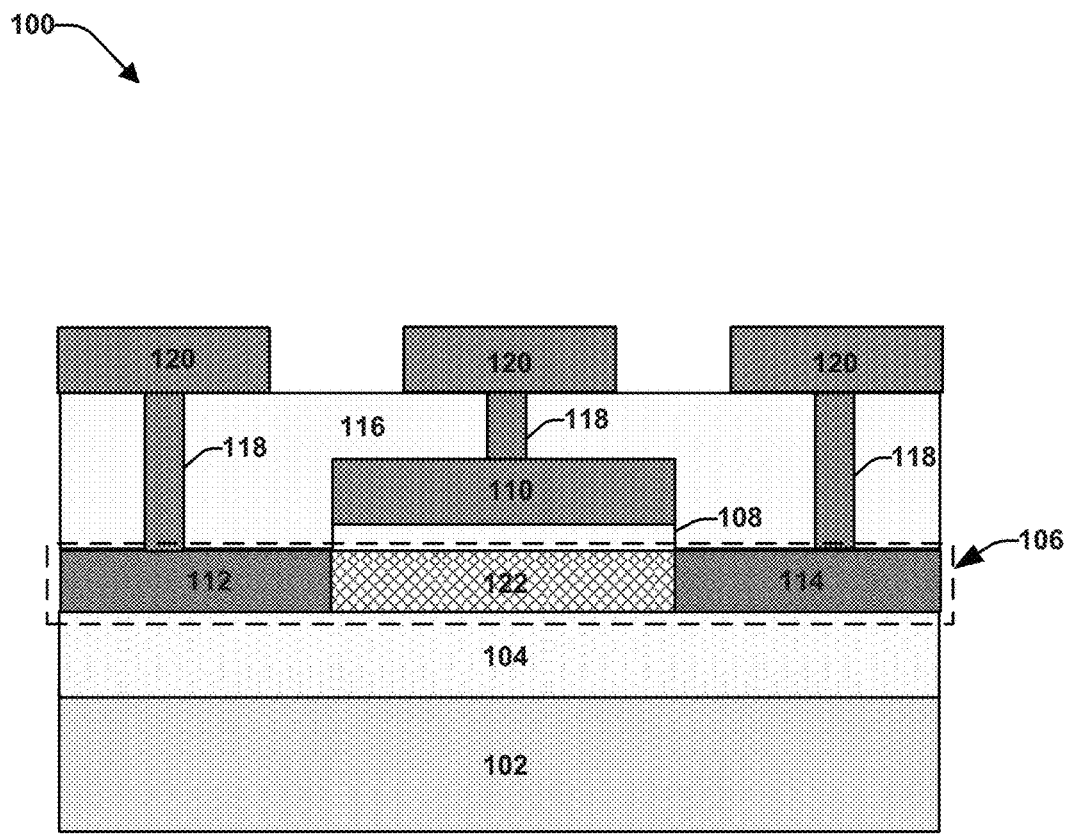
FIG. 1 presents a cross-sectional view of an example TFT having a polycrystalline silicon active layer formed by MIC of amorphous silicon in an oxidizing atmosphere, in accordance with one or more embodiments described herein.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of this disclosure may be practiced without these specific details, or with other methods, components, materials, etc. In other instances, well-known structures and devices are shown in block diagram form to facilitate describing the subject disclosure.

By way of introduction, the subject matter disclosed herein relates to an improved crystallization procedure for MIC of a-Si wherein the heat-treatment required by the crystallization is performed at least in part in an oxidizing ambience rather than in a non-oxidizing ambience as it has been traditionally performed. In various embodiments, the disclosed MIC process that crystallization of a-Si over two phases. The first phase involves initializing MIC of a-Si by annealing a three layer structure including a substrate, an a-Si layer formed on the substrate, and a metal catalyst layer formed on the a-Si layer, in a non-oxidizing atmosphere. The second phase involves continuing and completing MIC crystallization of the a-Si by annealing the three layer structure in an oxidizing atmosphere.

Conventional MIC calls for the introduction of a minimum amount of metal elements necessary for the nucleation and growth of polycrystalline silicon from a-Si at a temperature between about 400° C. to about 600° C. Led by nodules of metal silicide at the crystallization front, elongated grains of polycrystalline silicon grow from each crystal nucleus. When the crystallization fronts from neighboring nuclei collide, a well defined collision interface, containing a relatively large amount of metal residual, is formed. Such metal residual is considered a contaminant and degrades the performance of the devices on the resulting polycrystalline silicon thin film. The atmosphere used in the annealing process of conventional MIC is non-oxidizing, typically nitrogen.

In one or more embodiments of the subject disclosure, a MIC annealing process is initiated in a non-oxidizing atmosphere for a relatively short duration (e.g., about 1 hour). This causes metal of the metal catalyst to diffuse into the a-Si layer without being oxidized. The annealing is then continued in an oxidizing atmosphere for a relatively longer duration (e.g., about 9 hours). By switching from the non-oxidizing atmosphere to the oxidizing atmosphere during the crystallization process, the defect density (e.g., the amount of residual metal contamination) in the p-Si layer is reduced due to the generation and diffusion of silicon interstitials to the crystal grain boundaries. TFTs fabricated with the p-Si obtained using the proposed method exhibit improved device characteristics, including but not limited to, higher field-effect mobility, larger current on-off ratio and lower threshold voltage.

In one or more embodiments, a device is provided that includes a polycrystalline silicon layer formed on the substrate having resulted from metal-induced crystallization of an amorphous silicon layer formed on a substrate and having a metal layer formed thereon. The metal-induced crystallization of the amorphous silicon layer was performed for a first phase in non-oxidizing ambience followed by a second phase in an oxidizing ambience, thereby resulting in transformation of the amorphous silicon layer into the polycrystalline silicon layer.

In other embodiments, a transistor device, is provided that includes a source region and a drain region formed on a substrate, and an active channel region formed on the substrate and electrically connecting the source region and the drain region. The active channel region is formed with a polycrystalline silicon layer having resulted from annealing an amorphous silicon layer formed on the substrate and having a metal layer formed thereon, wherein the annealing of the amorphous silicon layer was at least partially performed in an oxidizing ambience, thereby resulting in crystallization of the amorphous silicon layer to form the polycrystalline silicon layer.

In one or more additional embodiments, a method is provided that includes forming an amorphous silicon layer comprising amorphous silicon on a substrate, forming a metal layer comprising metal on the amorphous silicon layer, and converting the amorphous silicon layer into a polycrystalline silicon layer, by: first annealing the amorphous silicon layer and the metal layer for a first duration in a non-oxidizing atmosphere; and second annealing the amorphous silicon layer and the metal layer for a second duration in an oxidizing atmosphere.

With reference now to the drawings, FIG. 1 presents a cross-sectional view of an example TFT device 100 fabricated in accordance with one or more embodiments described herein. A TFT is type of field-effect transistor made by depositing thin films of an active semiconductor layer as well as the dielectric layer and metallic contacts over a supporting (but non-conducting) substrate. The active semiconductor layer (e.g., denoted by arrow 106) of TFT device 100 includes p-Si formed on the substrate 102/ dielectric layer 104 via MIC of a-Si in at least a partially oxidized atmosphere. It should be appreciated that TFT device 100 is merely one exemplary embodiment of a TFT that can employ the subject p-Si films/layers as the active layer. A variety of TFT configurations (e.g., bottom-gate, top-gate, coplanar, staggered, etc.) are suitable candidate for the integration of the subject p-Si films.

Device 100 includes a substrate 102 having a dielectric layer 104 formed thereon. The material of the substrate 102 and the dielectric layer 104 can vary. In one or more embodiments, the substrate can include but is not limited to: silicon, glass, quartz or plastic. The substrate can vary in rigidity. In an aspect, the substrate is a flexible substrate (e.g., thin plastic for use in curved or flexible displays). In various embodiments, the dielectric layer 104 includes silicon dioxide ($SiO_2$). In an aspect, the $SiO_2$ is formed on the substrate via thermal oxidation (e.g., when the substrate 102 includes silicon). The thickness of the substrate 102 and the dielectric layer 104 can also vary. In an aspect, when the dielectric layer 104 includes thermal $SiO_2$, the thickness of the thermal $SiO_2$ is about 500 nm.

Device 100 further includes an active layer 106 formed on the dielectric layer 104 via MIC of a-Si in at least a partially oxidized atmosphere. In one embodiment, the p-Si of the active layer 106 is formed via MIC of an-Si layer formed on the substrate 102/dielectric layer 104, initially in a non-oxidizing atmosphere followed by continued crystallization of the a-Si layer in an oxidizing atmosphere. In another embodiment, the p-Si of the active layer 106 is formed via MIC of an a-Si layer formed on the substrate 102/dielectric layer 104 entirely in an oxidizing atmosphere. Unlike p-Si obtained using a conventional MIC process, the p-Si of active layer 106 includes silicon interstitials formed at the crystal boundaries based in part on annealing of the a-Si layer in an oxidizing ambience at a suitable temperature (e.g., between about 400° C. and 700° C.) and for a suitable duration (e.g., 9 or more hours). In particular, the Si interstitials are initially formed due to surface oxidation of the p-Si of active layer 106 and then move to the grain boundaries during the annealing process. In an aspect, the amount of silicon interstitials is about $10^{13}/cm^2$. The specific mechanisms via which the p-Si active layer 106 of device 100 is formed are described in greater detail infra with regards to FIGS. 2-4.

The active layer 106 includes a source region 112, a drain region 114 and a channel region 122. The channel region 122 electrically couples the source region 112 and the drain region 114. In an aspect, the source region 112 and the drain region 114 are formed via selective implantation of ions (e.g., boron, phosphorus, arsenic, etc.) into the outer regions of the active layer 106 using the gate stack (e.g., wherein the gate stack includes gate dielectric layer 108 and gate electrode 110) as a mask. The channel region 122 is formed with the un-doped p-Si material of the active layer 106. The thickness of the p-Si active layer 106 can vary depending on the thickness of the a-Si used to form the p-Si. In an aspect, the p-Si active layer 106 is between about 20 nm and about 200 nm. In an exemplary embodiment, the p-Si active layer 106 has a thickness of about 50 nm.

Device 100 further includes a gate stack formed over and adjacent to the channel region 122. The gate stack includes a gate dielectric layer 108 and a gate electrode 110. The material and thickness of the gate dielectric and the gate electrode can vary. In an aspect, the gate dielectric includes about 50 nm of $SiO_2$. The gate electrode 110 can include any suitable conducting metal and alloys thereof, including but not limited to: copper, aluminum, graphite, brass, silver, and platinum. In an exemplary embodiment, the gate electrode 110 includes aluminum and has a thickness of about 300 nm Device 100 further includes a passivation layer 116 formed over the gate stack and the source and drain regions 112 and 114. Metal leads 120 are formed on the passivation layer 116 and respectively connected to the source region 112, the gate electrode 110, and the drain region 114 via metal lines 118. The material of the metal leads 120 and the metal lines 118 can vary. For example, the material of the metal leads 120 and the metal lines 118 can include but is not limited to copper, aluminum, graphite, brass, silver, and platinum.

Figure 2:
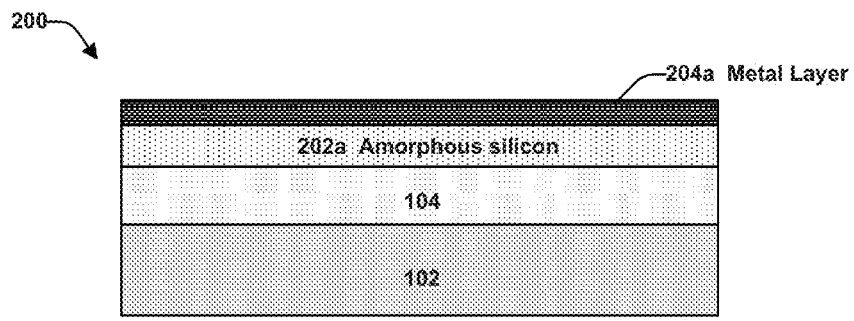
FIG. 2 presents a cross-sectional view of an example intermediate TFT structure formed in association with a process for forming a polycrystalline silicon active layer via MIC of amorphous silicon in an oxidizing atmosphere, in accordance with one or more embodiments described herein.
Figure 3:
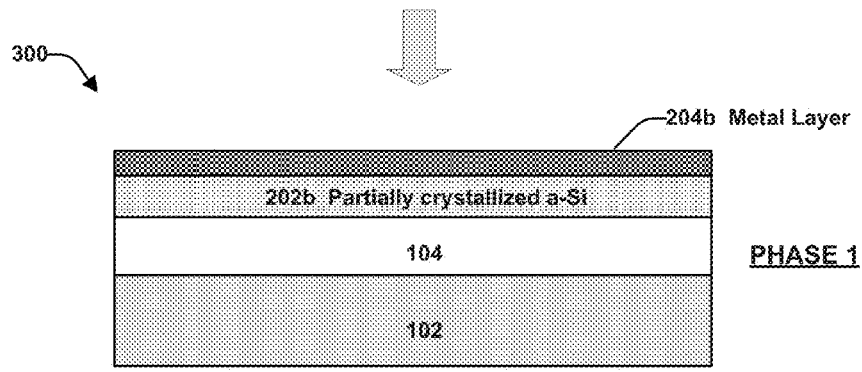
FIG. 3 presents a cross-sectional view of another example intermediate TFT structure formed in association with a process for forming a polycrystalline silicon active layer via MIC of amorphous silicon in an oxidizing atmosphere, in accordance with one or more embodiments described herein.
Figure 4:
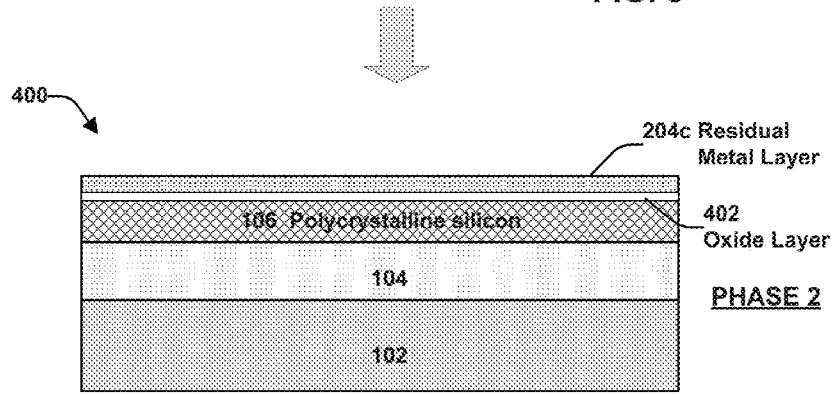
FIG. 4 presents a cross-sectional view of another example intermediate TFT structure having a polycrystalline silicon active layer formed via MIC of amorphous silicon in an oxidizing atmosphere, in accordance with one or more embodiments described herein.

FIGS. 2-10 pictorially depict an example process for fabricating TFT device 100. FIGS. 2-4 particularly depict an example process for forming an intermediate TFT structure 400 including a p-Si layer formed on a substrate via MIC of a-Si at least partially in an oxidizing atmosphere. FIGS. 5-10 present an example process for forming a TFT device (e.g., TFT device 100) using the resulting structure 400. Repetitive description of like elements employed in other embodiments described herein is omitted for sake of brevity.

With reference to FIG. 2 presented is an intermediate TFT structure 200 that includes a substrate 102 having a dielectric layer 104 formed thereon. Structure 202 further includes an a-Si layer 202a formed on an adjacent to the dielectric layer 104 and a metal layer 204a formed on and adjacent to the a-Si layer 202a. In an embodiment, the substrate 102 is a silicon wafer and the dielectric layer 104 includes thermal oxide ($SiO_2$) grown on the substrate to a thickness of about 500 nm. After formation of the thermal oxide dielectric layer 104, the a-Si is deposited thereon using low-pressure chemical vapor deposition (LPCVD). Thereafter, a thin layer/film of metal is deposited on the a-Si to form the metal layer 204a. The thickness of the deposited a-Si layer 202a can vary. In an aspect, the thickness of the a-Si layer 202a is between about 20 nm and about 200 nm. In another aspect, the thickness of the a-Si layer 202a is between about 400 nm and about 100 nm. In yet another aspect, the thickness of the a-Si layer 202a is about 50 nm.

The metal layer 204a servers as a catalyst for crystallization of the a-Si. The material of the metal layer 204a can vary. In an exemplary embodiment, the metal layer 204a includes nickel (Ni), chromium (Cr), and/or chemical compounds and alloys of Ni and Cr. However, other suitable materials for the metal layer 204a can include but are not limited to platinum (Pt), aluminum (Al), gold (Au), Silver (Ag), Tin (Tn), and/or chemical compounds or alloys of Pt, Al, Au, Ag, and Tn. The thickness of the metal layer 204a can also vary. In an one or more embodiments, the thickness of the metal layer 204a is between about 0.05 nm and about 10 nm, and preferably less than 5 nm. In an aspect, the metal layer 204a includes is uniform and servers as a cap that covering the entire surface of the a-Si layer 202. In another aspect, the metal layer 204a is deposited in the form of a pattern. According to this aspect, some portions of the surface of the a-Si layer 202a are exposed while other portions of the surface of the a-Si layer 202a are covered with the metal layer 204a.

After formation of structure 200, structure 200 is then subjected to heat treatment to induce crystallization of the a-Si layer 202a. In one or more embodiments, the heat treatment applied to structure 200 includes two phases, a non-oxidizing phase and an oxidizing phase.

FIG. 3 presents another intermediate TFT structure 300 formed during the first phase wherein structure 200 is annealed in a non-oxidizing atmosphere. During the first phase, the metal-based crystallization-inducing agent of the metal layer 204a (e.g., Ni) migrates the a-Si layer 202a without being oxidized and the metal layer 204a is transformed into partially reacted metal layer 204b. As metal elements of the metal layer 204a are driven into the a-Si layer 202a, the a-Si layer 202a is transformed into a partially crystallized a-Si layer 202b. In an aspect, the mechanism via which the metal layer 204a facilitates the crystallization of a-Si results in a portion of the metal elements of the metal layer 204a being included in the partially crystallized a-Si layer 202b.

The non-oxidizing atmosphere of the first phase can include nitrogen (e.g., nitrogen dioxide $N_2$), Argon (Ar), or other suitable non-oxidizing atmosphere elements or their mixtures. The temperature, type, and duration of the heat treatment employed for the first phase can vary. In an exemplary embodiment, during the first phase, structure 200 is annealed at a temperature between about 400° C. and about 700° C., and preferably at a temperature of about 600° C. In one embodiment, structure 200 is annealed using a rapid-thermal annealing (RTA) process. With RTA, structure 200 is heated to the desired temperature by bringing the structure 200 near or in contact with a heating lamp, a hot chuck, a hot plate, or other suitable heating source. In another embodiment, during the first phase, structure 200 is annealed in an annealing furnace. An annealing furnace is a structure designed for very uniform heating, followed by a gradual cooling process. The furnace includes a heating chamber in which structure 200 is placed within and heated to the desired temperature. During the first phase, to prevent oxidation of structure 200, the heating chamber is airtight, with a slightly positive pressure (e.g., 1.0 atmosphere).

The duration of the first phase can also vary. In an aspect, during the first phase, structure 200 is annealed for a duration between about 10 minutes and about 2 hours. In another aspect, structure 200 is annealed for a duration between about 30 minutes and about 1.5 hours. In yet another aspect, structure 200 is annealed for a duration of about 1 hour.

FIG. 4 presents another intermediate TFT structure 400 formed during the second phase wherein structure 300 is annealed in a oxidizing atmosphere. During the second phase, the partially crystallized a-Si layer 202b is further crystallized into a polycrystalline silicon or p-Si layer 106. The p-Si layer 106 formed after completion of the second phase is fully crystallized (e.g., 100% crystallized), or substantially fully crystallized (e.g., between 90-100% crystallized). Metal layer 204c includes the remaining or residual un-reacted metal of the metal layer 204b. The oxidizing atmosphere of the second phase can include $O_2$, $H_2O$, $N_2O$, air or other oxidizing atmosphere or their mixtures. The temperature and type of the heat treatment employed for the second phase can vary. In an exemplary embodiment, during the second phase, structure 300 is annealed at a temperature between about 400° C. and about 700° C., and preferably at a temperature of about 600° C. In one embodiment, structure 300 is annealed using a rapid-thermal annealing (RTA) process. In another embodiment, structure 300 is annealed in an annealing furnace that has an oxidizing atmosphere. In yet another embodiment, structure 300 is annealed in an oxidizing plasma generator.

The duration of the second phase can also vary. However, the duration of the second phase is generally longer than the duration of the first phase and preferably longer than 8 hours. In an aspect, during the second phase, structure 300 is annealed for a duration between about 8 hours and about 12 hours. In another aspect, structure 300 is annealed for a duration between about 9 hour and about 11 hours. In another aspect, structure 300 is annealed for a duration between about 9 hours and about 10 hours. In yet another aspect, structure 200 is annealed for a duration between about 9.5 hours and about 10 hours. It should be appreciated however that the annealing duration of the first phase, the second phase, and the total annealing duration can vary based on the temperature used to perform the annealing, (e.g., the time required to realize full crystallization is related to process temperature). For example, if a higher temperature is used then the total anneal time can be shortened (e.g., the higher the temperature, the shorter the anneal time).

In various embodiments, the total duration of annealing including the first phase and the second phase is about 10 hours. In an aspect, the duration of the first phase is less than or equal to about 30% of the duration of the second phase. In another aspect, the duration of the first phase is less than or equal to about 20% of the duration of the second phase. In yet another aspect, the duration of the first phase is less than or equal to about 10% of the duration of the second phase. Still in yet another aspect, the duration of the first phase is less than or equal to about 5% of the duration of the second phase.

In one or more embodiments, the temperature of the heat treatment during the first phase and the second phase is the same or substantially the same. In another aspect, the temperature of the heat treatment during the first phase is greater than the temperature of the heat treatment of the second phase. In yet another aspect, the temperature of the heat treatment during the second phase is greater than the temperature of the heat treatment of the first phase. In some aspects, the same heat treatment is applied during the first phase and the second phase. For example, both the first phase and the second phase can be performed in a furnace or using RTA. In another aspect, the type of heat treatment employed during the first phase and the second phase can vary. For example, the first phase can be performed in a furnace while the second phase can be performed using RTA, or vice versa.

The quality of the p-Si layer 106 of structure 400 is a function of the annealing conditions described above. During the oxidizing annealing of the second phase, a thin oxide layer 402 ($SiO_2$) layer is grown on the surface of the p-Si layer 106 and silicon interstitials (not shown) are generated and injected into the p-Si layer 106. When the surface of silicon is oxidized, a volume expansion occurs and induces stress. Part of the stress is relieved do to the injection of the silicon interstitials into the bulk of the p-Si layer 106. When annealed in an oxidizing ambience at a temperature below 700° C. for a duration greater than or equal to about 9 hours, the thickness of the thin oxide layer 402 formed on the p-Si layer is about 2 to 3 nm, and the amount of silicon interstitials injected into the silicon bulk is about $10^{13}/cm^2$.

The enhanced quality of the p-Si layer 106 over p-Si obtained using conventional MIC is at least partially attributed to these silicon interstitials. In particular, during the second phase, these silicon interstitials diffuse into the partially crystallized a-Si layer 202b/p-Si layer 106 and are incorporated into the p-Si crystal grain boundaries. TFTs fabricated using the p-Si layer 106 as an active layer exhibit improved device performance.

In various other embodiments, rather than performing the two phases discussed above, structure 200 is subjected to a single heat treatment entirely in an oxidizing atmosphere. With these embodiments, structure 200 is annealed in an oxidizing atmosphere under the conditions of phase 2. The temperature, duration, and type of heat treatment can also vary. In an embodiment, structure 400 is formed by annealing structure 200 at a temperature between about 400° C. and 700° C., (preferably 600° C.) in an oxidizing ambience in a furnace, using RTA, or using an oxidizing plasma generator. The duration of the annealing can range from 8 hour to about 12 hours, and is preferably between about 9 hours and 10 hours.

Figure 5:
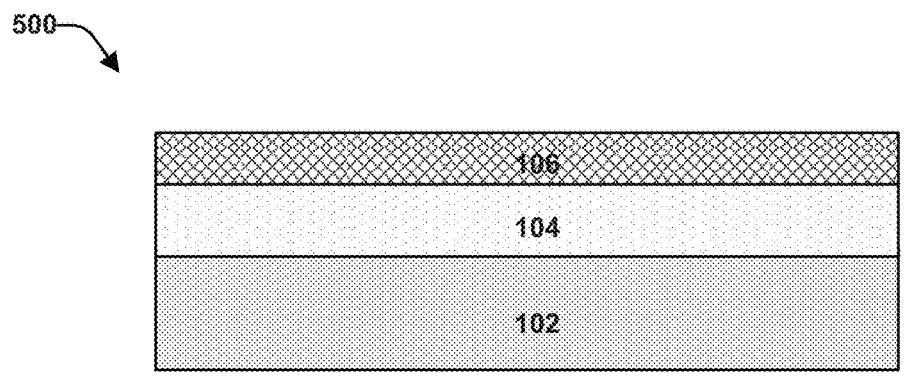
FIG. 5 presents a cross-sectional view of an example intermediate TFT structure formed in association with a process for forming a TFT having a polycrystalline silicon active layer formed via MIC of amorphous silicon in an oxidizing atmosphere, in accordance with one or more embodiments described herein.

Referring now to FIG. 5, presented is another intermediate TFT structure 500 formed via processing of structure 400 in accordance with fabricating a TFT device (e.g., TFT device 100) using structure 400. Structure 500 includes the substrate 102, the dielectric layer 104, and the p-Si layer 106. In one or more embodiments, in order to form structure 500, after the formation of the p-Si layer 106, structure 400 is cleaned to remove un-reacted metal (e.g., nickel) that may remain as a residual metal layer 204c. In an aspect, the un-reacted metal is removed via wet chemical etching. For example, the residual metal layer 204 can be removed using a mixture of hot $H_2SO_4$ and $H_2O_2$, or another suitable solution. In addition, structure 400 is cleaned to remove any oxide (e.g., oxide layer 402) formed on the surface of the p-Si layer 106 during the oxidizing annealing of phase 2 and/or during the nickel cleaning process. In an aspect, such oxide can be removed via HF dipping.

After formation of structure 500, the p-Si layer 106 is patterned to form one or more active islands (not shown), and a gate stack is formed on portions of the p-Si layer 106 layer corresponding to a channel region. The structure of the gate stack can vary. In an exemplary embodiment, the gate stack includes a dielectric layer 108 and a gate electrode 110.

Figure 6:
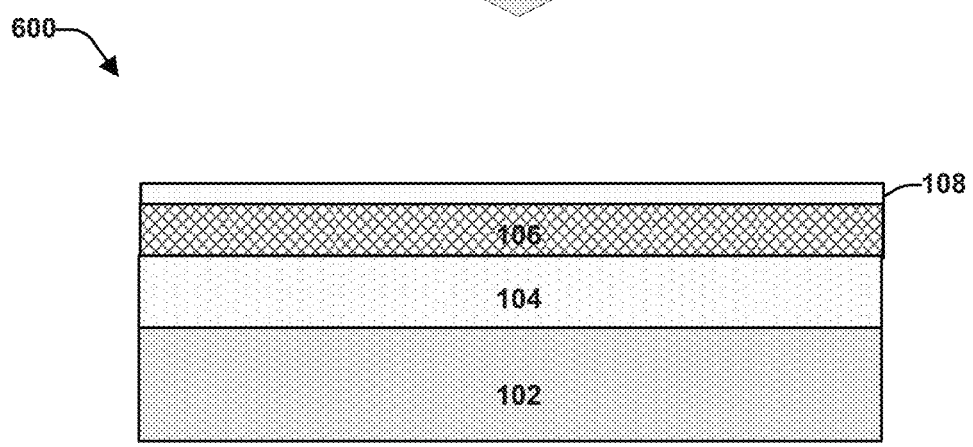
FIG. 6 presents a cross-sectional view of another example intermediate TFT structure formed in association with a process for forming a TFT having a polycrystalline silicon active layer formed via MIC of amorphous silicon in an oxidizing atmosphere, in accordance with one or more embodiments described herein.

FIG. 6 presents an intermediate TFT structure 600 following formation of the gate dielectric layer 108 on structure 500. In an aspect, the gate dielectric layer 108 is deposited via LPCVD. For example, the gate dielectric layer 108 can include about 50 nm thick of $SiO_2$ that is deposited on the p-Si layer by LPCVD at 425° C. and then patterned.

Figure 7:
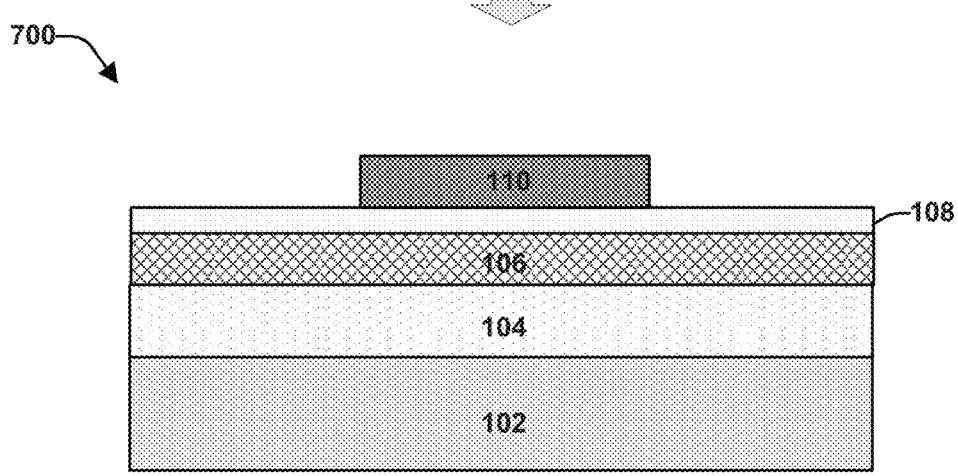
FIG. 7 presents a cross-sectional view of another example intermediate TFT structure formed in association with a process for forming a TFT having a polycrystalline silicon active layer formed via MIC of amorphous silicon in an oxidizing atmosphere, in accordance with one or more embodiments described herein.

FIG. 7 presents an intermediate TFT structure 700 following formation of the gate electrode 110 on the gate dielectric layer 108. In an aspect, the gate electrode 110 is deposited on the gate dielectric via sputtering. Thereafter the gate electrode 110 is patterned. For example, the gate electrode 110 can include about 300 nm of aluminum (Al) was then deposited by sputtering and patterned as the gate electrode.

Figure 8:
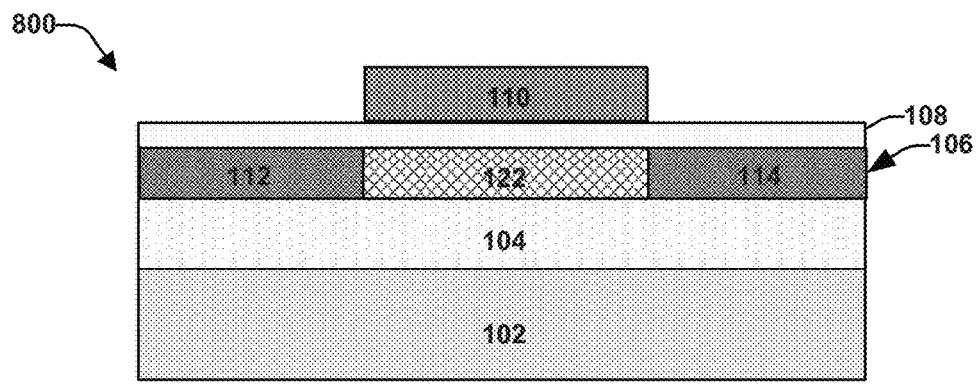
FIG. 8 presents a cross-sectional view of another example intermediate TFT structure formed in association with a process for forming a TFT having a polycrystalline silicon active layer formed via MIC of amorphous silicon in an oxidizing atmosphere, in accordance with one or more embodiments described herein.

FIG. 8 presents an intermediate TFT structure 800 following formation of the source, drain, and channel regions (e.g., source region 112, drain region 114, and channel region 122) within the p-Si active layer 106 of structure 700. In an aspect, the source and drain regions are formed via implantation of ions into the p-Si active layer 106 using the gate stack as a mask. Accordingly the source and drain regions are self-aligned on either sides of the gate stack. The channel region 122 includes the portion of the p-Si active layer 106 that remains un-doped between the source and drain regions. In an aspect, the source and drain regions are formed via implantation of boron (or another suitable element) at dose of about $4 \times 10^{15}/cm^2$ and an energy of 20 keV.

Figure 9:
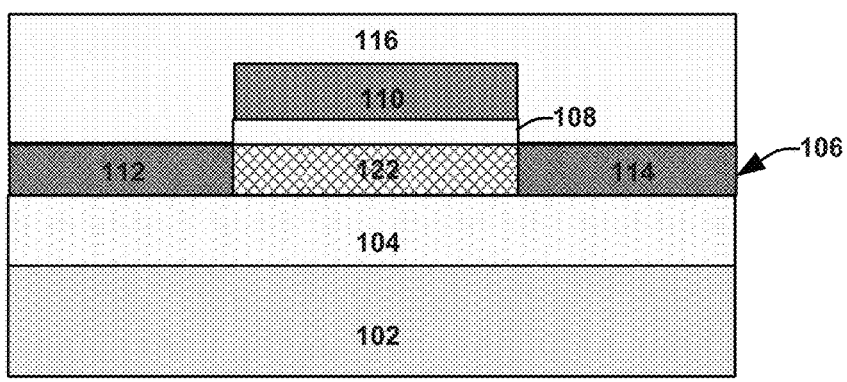
FIG. 9 presents a cross-sectional view of another example intermediate TFT structure formed in association with a process for forming a TFT having a polycrystalline silicon active layer formed via MIC of amorphous silicon in an oxidizing atmosphere, in accordance with one or more embodiments described herein.

After formation of the source, drain and channel regions, a passivation layer 116 is deposited and patterned over the gate stack and the source and drain region. The resulting intermediate TFT structure is depicted in FIG. 9. In an aspect, the passivation layer includes about 500 nm of $SiO_2$ deposited via LPCVD. According, the gate dielectric layer 108 and the passivation layer 116 can include the same material (e.g., $SiO_2$).

Figure 10:
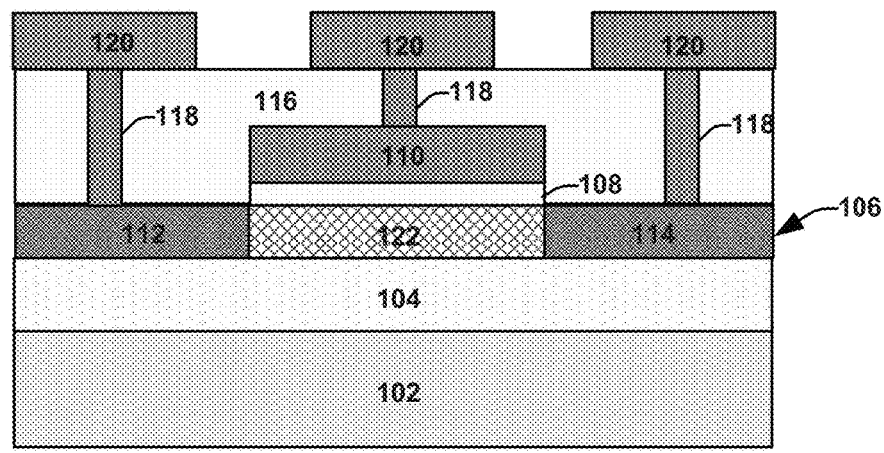
FIG. 10 presents a cross-sectional view of an example TFT having a polycrystalline silicon active layer formed by MIC of amorphous silicon in an oxidizing atmosphere, in accordance with one or more embodiments described herein.

FIG. 10 presents a resulting TFT device 1000 following formation of the metal leads 120 and lines 118 in structure 900. In an aspect, contact holes are formed through the passivation layer 116 to the source region 112, the gate electrode 110, and the drain region 114, respectively. A metal layer is then formed on the passivation layer 116 and within the contact holes to form the metal lines 118. The portion of the metal layer on the passivation layer 116 is further patterned to form the metal leads 120. In an aspect, the metal layer that is used to form the metal lines 118 and the metal leads includes about 700 nm of aluminum with 1% silicon (Al/1% Si). Thereafter, device 1000 is sintered in forming gas for about 30 minutes at 420° C.

Figure 11:
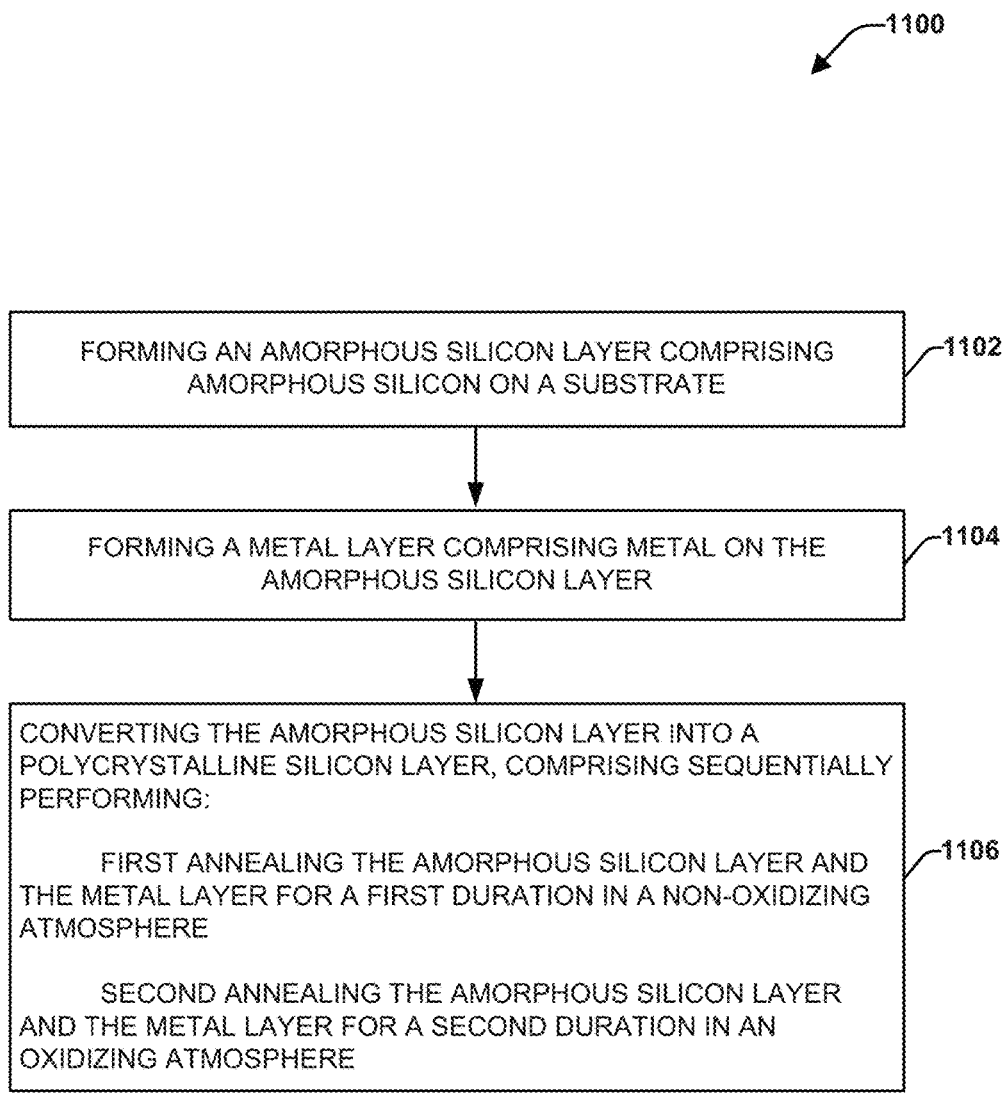
FIG. 11 provides a flow diagram of an example method for forming a polycrystalline silicon active layer via MIC of amorphous silicon in an oxidizing atmosphere, in accordance with one or more embodiments described herein.
Figure 12:
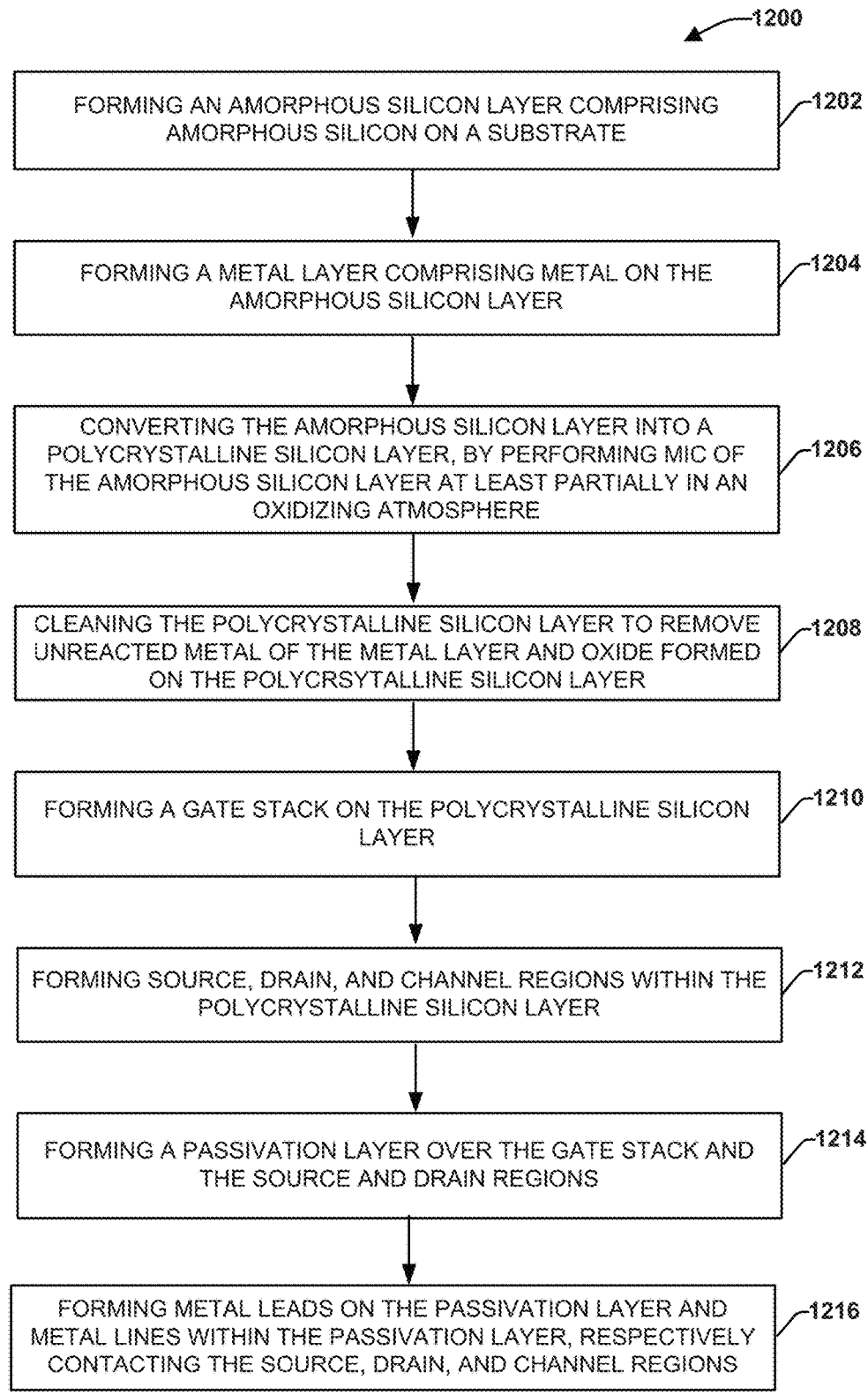
FIG. 12 provides a flow diagram of an example method for forming a TFT with a polycrystalline silicon active layer formed via MIC of amorphous silicon in an oxidizing atmosphere, in accordance with one or more embodiments described herein.
Figure 14:
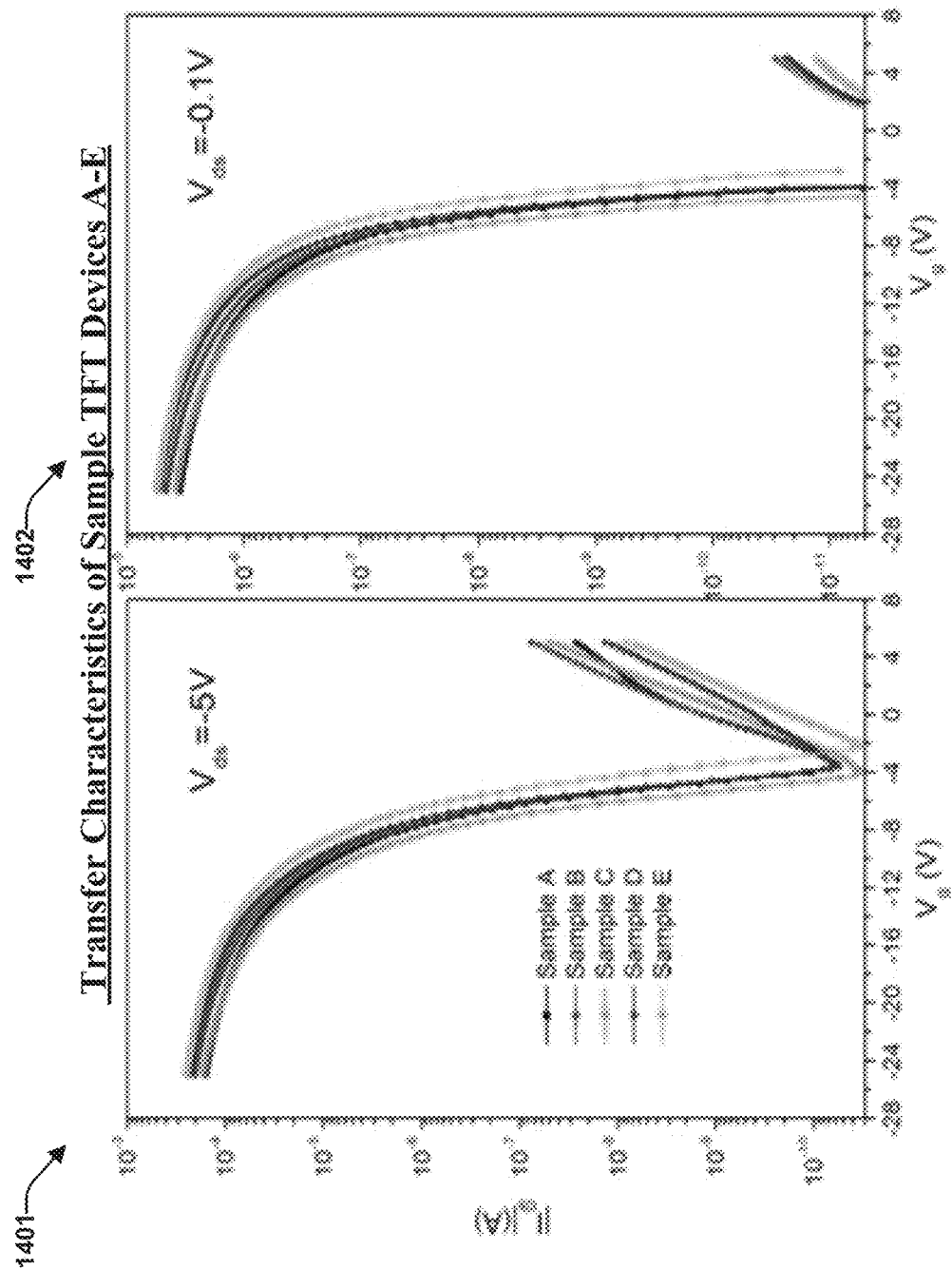
FIGS. 14A-14B provides graphs 1401 and 1402, respectively, illustrating the transfer characteristics of five different TFT devices A-E formed in accordance with aspects and embodiments described herein.

FIGS. 11-12 illustrate methods in accordance with certain aspects of this disclosure. While, for purposes of simplicity of explanation, the methods are shown and described as a series of acts, it is to be understood and appreciated that this disclosure is not limited by the order of acts, as some acts may occur in different orders and/or concurrently with other acts from that shown and described herein. For example, those skilled in the art will understand and appreciate that methods can alternatively be represented as a series of interrelated states or events, such as in a state diagram. Moreover, not all illustrated acts may be required to implement methods in accordance with certain aspects of this disclosure. Additionally, it is to be further appreciated that the method disclosed hereinafter and throughout this disclosure is capable of being stored on an article of manufacture to facilitate transporting and transferring such methods to computers.

Turning now to FIG. 11, presented is a high level flow diagram of an example method 1100 for MIC of amorphous silicon in an oxidizing atmosphere, in accordance with aspects and embodiments described herein. At 1102, an amorphous silicon layer including amorphous silicon is formed on a substrate. At 1104, a metal layer including metal is formed on the amorphous silicon layer. At 1106, the amorphous silicon layer is converted into a polycrystalline silicon layer by first annealing the amorphous silicon layer and the metal layer for a first duration in a non-oxidizing atmosphere, and second annealing the amorphous silicon layer and the metal layer for a second duration in an oxidizing atmosphere. In an exemplary embodiment, the annealing in the non-oxidizing atmosphere and the oxidizing atmosphere is performed at 700° C. or less, the first duration is about 1 hour or less, and the second duration is about 1 hour or more.

FIG. 12 presents a high level flow diagram of an example method 1200 for fabricating a TFT with an active p-Si layer formed via MIC of amorphous silicon in an oxidizing atmosphere, in accordance with aspects and embodiments described herein. At 1202, an amorphous silicon layer including amorphous silicon is formed on a substrate. At 1204, a metal layer including metal is formed on the amorphous silicon layer. At 1206, the amorphous silicon layer is converted into a polycrystalline silicon layer by performing MIC of the amorphous silicon layer at least partially in an oxidizing atmosphere. In an aspect, the MIC is performed only in an oxidizing atmosphere. In another aspect, the MIC includes first annealing the amorphous silicon layer and the metal layer for a first duration in a non-oxidizing atmosphere, and second annealing the amorphous silicon layer and the metal layer for a second duration in an oxidizing atmosphere. In an exemplary embodiment, the annealing in the non-oxidizing atmosphere and the oxidizing atmosphere is performed at 700° C. or less, the first duration is about 1 hour or less, and the second duration is about 1 hour or more.

At 1208, the polycrystalline silicon layer is cleaned to remove un-reacted metal of the metal layer and oxide formed on the polycrystalline silicon layer. At 1210, a gate stack is formed on the polycrystalline silicon layer. At 1212, source, drain, and channel regions are formed within the polycrystalline silicon layer. At 1214, a passivation layer is formed over the gate stack and the source and drain regions. At 1216, metal leads are formed on the passivation layer and metal lines are formed within the passivation layer, respectively contacting the source, drain, and channel regions.

FIG. 13-17 provide experimental data demonstrating the superior characteristics of a TFT device (e.g., device 100) formed using a structure (e.g., structure 400) including p-Si layer formed on a substrate via MIC of a-Si in at least partially in an oxidizing atmosphere. Repetitive description of like elements employed in other embodiments described herein is omitted for sake of brevity.

FIG. 13 provides a table 1300 (Table 1) defining the various annealing durations and conditions of different p-Si active layers included in five different TFT devices A-E formed in accordance with aspects and embodiments described herein. The fabrication of each of the sample TFT devices A-E began with growth of about a 500 nm thick layer of thermal oxide on a silicon wafer. A 45 nm thick a-Si layer was then formed on the TFT device structure by LPCVD. A thin layer of nickel (e.g., about 5 nm) was then deposited on the a-Si layer. MIC was then carried out on each of the structures by annealing at 600° C. for a fixed total annealing time of 10 hours in a furnace under the different conditions summarized in Table 1.

As a control sample, sample A was annealed for 10 hours in a non-oxidizing ($N_2$) only ambience. Sample B was annealed for 10 hours in an oxidizing ($O_2$) only ambience. Sample C was annealed for 2 hours in a non-oxidizing ambience and then oxidized for 8 hours in an oxidizing ambience. Sample D was annealed for 1 hour in a non-oxidizing ambience and then oxidized for 9 hours in an oxidizing ambience. Sample E was annealed for 0.5 hours in a non-oxidizing ambience and then oxidized for 9.5 hours in an oxidizing ambience.

For each of the sample structures, after formation of the MIC p-Si layer, the un-reacted nickel was then removed using a mixture of hot $H_2SO_4$ and $H_2O_2$. Any $SiO_2$ formed on the surface of the p-Si during the annealing or the nickel cleaning process was also removed through HF dipping. The MIC p-Si layer was than patterned to form the active islands. 50 nm thick of $SiO_2$ was then deposited by LPCVD at 425° C. as the gate dielectric. 300 nm thick Al was then deposited by sputtering and patterned as the gate electrode. Self-aligned source and drain regions were implanted with boron at dose $4\times10^{15}/cm^2$ and an energy of 20 keV. 500 nm thick of $SiO_2$ was then deposited by LPCVD as the passivation layer before the contact holes were defined. 700 nm thick of al-1% Si was sputtered and patterned as the metal leads. Finally, the devices were sintered in forming gas for 30 minutes at 420° C.

FIGS. 14A and 14B provides graphs 1401 and 1402, respectively, illustrating the transfer characteristics of sample TFT devices A-E. FIG. 14A illustrates the transfer characteristics of TFT devices A-E at a drain bias of −5V and FIG. 14B illustrates the transfer characteristics of TFT devices A-E at a drain bias of −0.1 V. From graphs 1401 and 1402, it can be seen that sample E exhibits the largest on-state current and lowest threshold voltage.

Figure 15:
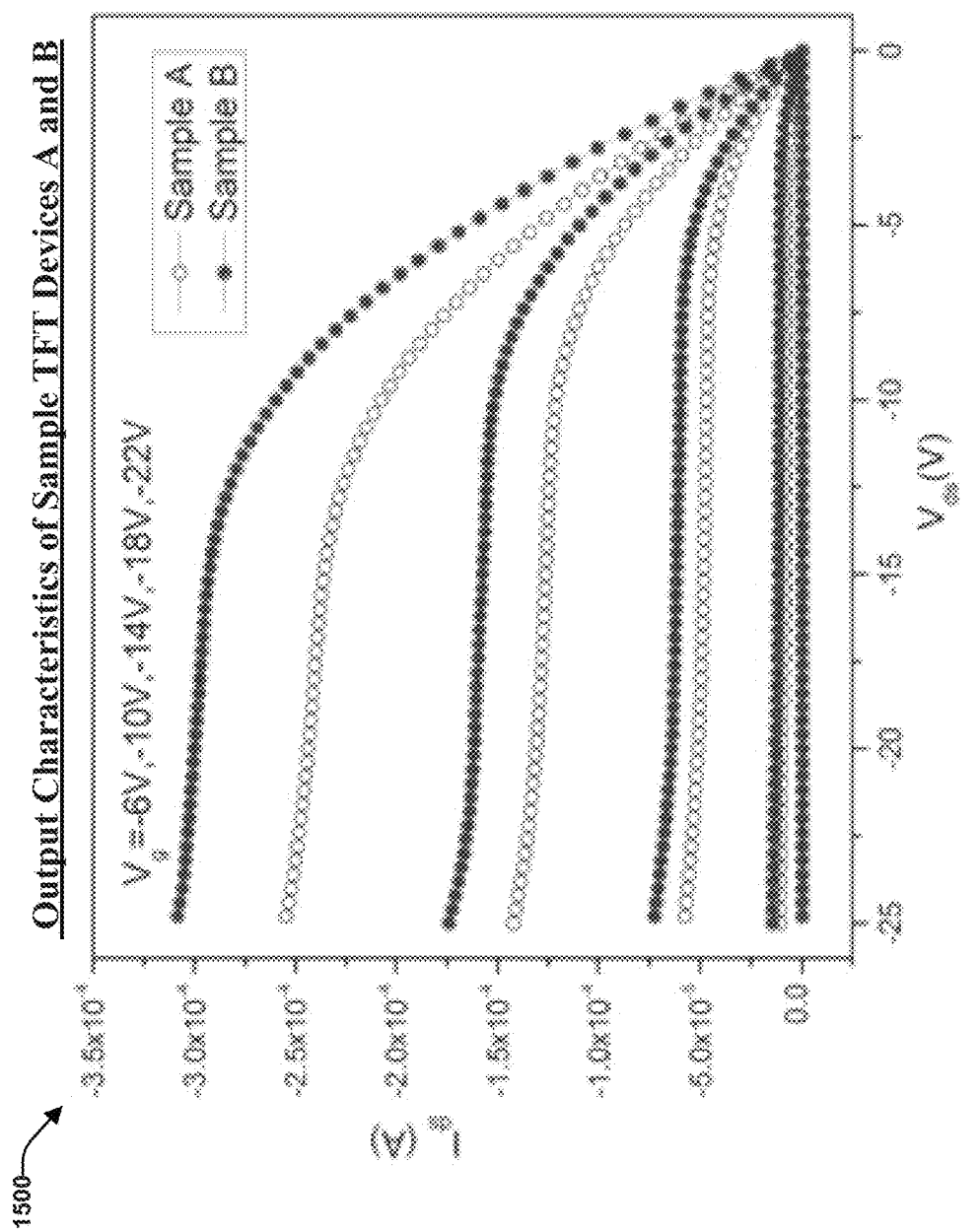
FIG. 15 provides a graph illustrating the output characteristics of sample TFT devices A and sample TFT device B formed in accordance with aspects and embodiments described herein.

FIG. 15 provides a graph 1500 illustrating the output characteristics of sample TFT device A and sample TFT device B. As seen in graph 1500, TFT device B (oxidizing annealing only) exhibits a larger on-state current and lower threshold voltage compared to sample TFT device A (non-oxidizing annealing only).

Figure 16:
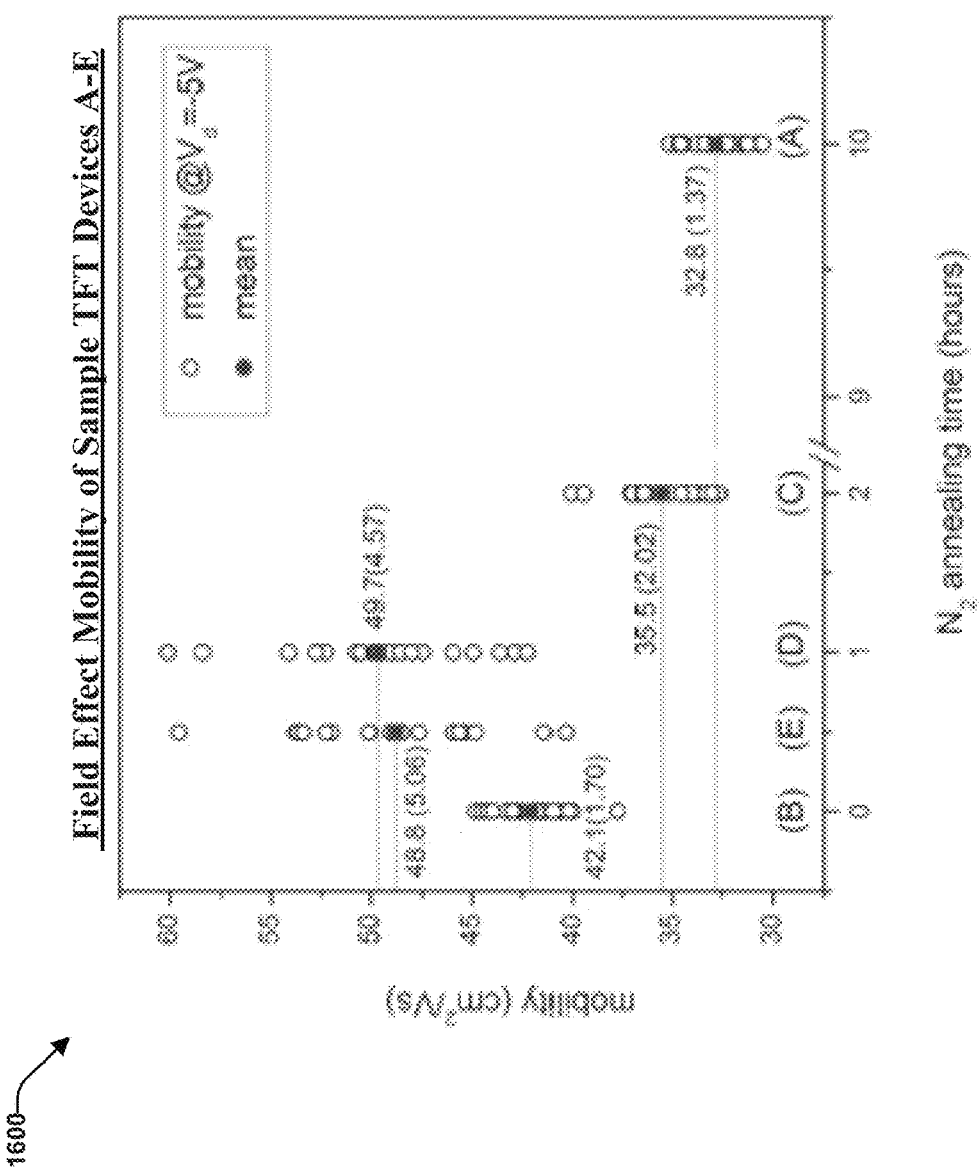
FIG. 16 provides a graph illustrating the distributions of the field-effect mobility of five different TFT devices A-E formed in accordance with aspects and embodiments described herein.
Figure 17:
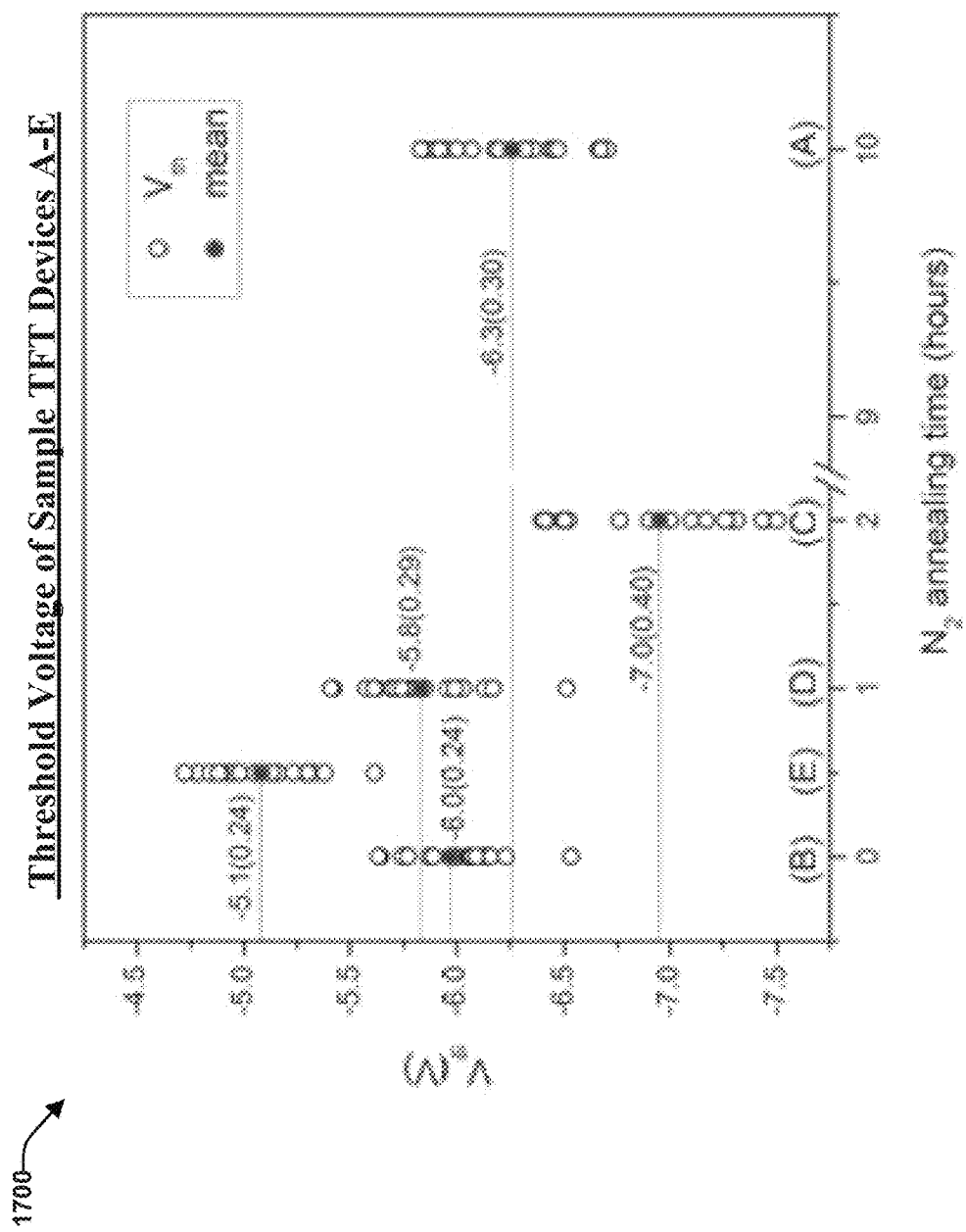
FIG. 17 provides a graph illustrating the distributions of the threshold voltages of five different TFT devices A-E formed in accordance with aspects and embodiments described herein.

FIG. 16 provides a graph 1600 illustrating the distributions of the field-effect mobility for the different sample TFT devices A-E, and FIG. 17 provides a graph 1700 illustrating the distributions of the threshold voltage ($V_{th}$) for the different sample TFT devices A-E. In order to generate graphs 1700 and 1800, 20 sample devices were fabricated and measured for each sample device A-E prototype. The red dot denotes the mean $V_{th}$ for each sample group. The electrical properties were measured at room temperature using an HP 4156B semiconductor parameter analyzer. The respective channel length (L) and width (W) of the devices were 10 and 10 μm.

FIG. 18 provides a table 1800 (Table 2) summarizing the mean electrical properties of the sample TFT devices A-E as illustrated in graphs 1600 and 1700. As seen in Table 2, the threshold voltage of the control sample TFT device A is −6.26 V, the on-off ratio is $2.7\times10^6$, and the mobility is 32.8 $cm^2/Vs$. Sample TFT devices B, D and E produced in accordance with the subject techniques exhibit larger on-state current, a lower threshold voltage, and a higher mobility. In particular, the extracted field-effect mobility of the sample TFT B device is increased by 28% relative to that of the sample A TFT device. The improvement of the TFT performance of the sample B device is attributed to the oxidizing annealing process, during which silicon interstitials are generated and injected into the p-Si layer. In particular, these silicon interstitials are incorporated into the crystal grain boundaries of the p-Si which reduces the defect density of the MIC p-Si film. The amount of the silicon interstitials is about $10^{13}/cm^2$. Because thermal oxide formed on the p-Si was removed from the TFT devices before active layer patterning, the effect of possible gate dielectric interface change is eliminated.

A potential problem with sample TFT device B is that the nickel catalyst was in direct contact with oxygen at the beginning of the annealing process. It has been reported that Ni diffusion and its reaction with Si may be degraded when MIC is carried out in an oxidizing ambience. Accordingly to optimize the MIC process, the annealing was split into two phases for sample TFT devices C, D and E. In the first stage, the crystallization was initiated in nitrogen. The nickel catalyst was driven in to the a-Si film without being oxidized. After this drive-in process, the atmosphere was switched to an oxidizing one to complete crystallization. The thin native $SiO_2$ formation and the generation and diffusion of silicon interstitials were realized in the second phase.

As seen in Table 2, the mobility of the sample TFT devices D and E do not show much difference. This indicates that 0.5 hours is a sufficient amount of time for the drive-in process of phase 1. The mobility of the sample TFT device C is lower than the mobility of sample TFT devices D and E, reflecting that 8 hours of crystallization in an oxidizing atmosphere has resulted in the generation of an amount of silicon interstitials that is less desirable. Accordingly, annealing in an oxidizing atmosphere for a duration of 9 or more hours is preferred. With the subject two-phase annealing MIC process, samples D and E exhibit the best electrical performance. When compared to sample A, the field-effect mobility is increased by 51%. Moreover, sample E demonstrated the lowest threshold voltage.

What has been described above includes examples of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A device, comprising:
a polycrystalline silicon layer formed on a substrate,
wherein the polycrystalline silicon layer comprises crystal grains with silicon interstitials formed at boundaries between the crystal grains having resulted from a first metal-induced crystallization, in an oxidizing ambience, of a partially crystallized amorphous silicon layer formed on the substrate and comprising a partially reacted metal layer formed on the partially crystallized amorphous silicon layer and metal elements formed within the partially crystallized amorphous silicon layer, thereby transforming the partially crystallized amorphous silicon layer into the polycrystalline silicon layer, and
wherein the metal elements were formed within the partially crystallized amorphous silicon layer from a second metal-induced crystallization, in a non-oxidizing ambience, of an amorphous silicon layer formed on the substrate and comprising a metal layer formed on and contacting the amorphous silicon layer, thereby transforming the amorphous silicon layer into the partially crystallized amorphous silicon layer.

2. The device of claim 1, wherein the amount of silicon interstitial is about $10^{13}/cm^2$.

3. The device of claim 1, wherein the second metal-induced crystallization comprises heating the amorphous silicon layer and the metal layer for a first duration and at a first temperature in the non-oxidizing ambience, thereby resulting in diffusion of the metal elements from the metal layer into the amorphous silicon layer, and wherein the first metal-induced crystallization comprises heating the partially crystallized amorphous silicon layer and the partially reacted metal layer for a second duration and at second temperature in the oxidizing ambience, thereby resulting in formation of the polycrystalline silicon layer.

4. The device of claim 1, wherein the second metal-induced crystallization was performed before the first metal-induced crystallization, and wherein the second metal-induced crystallization was performed for a duration of one hour or less and the first metal-induced crystallization was performed for a duration of nine hours or more.

5. The device of claim 1, wherein the second metal-induced crystallization and the first metal-induced crystallization were performed in an annealing furnace or using a rapid-thermal annealing process.

6. The device of claim 1, wherein the second metal-induced crystallization and the first metal-induced crystallization were performed at a temperature between about 400° C. and 700° C.

7. The device of claim 1, wherein the first metal-induced crystallization comprises heating the partially crystallized amorphous silicon layer and the partially reacted metal layer using an oxidizing plasma generator.

8. The device of claim 1, wherein the substrate comprises at least one of glass, quartz or plastic.

9. The device of claim 1, wherein the amorphous silicon layer has a thickness between about 20 nm and 200 nm.

10. The device of claim 1, wherein the metal layer comprises at least one of: nickel (Ni), platinum (Pt), or chemical compounds or alloys of Ni or Pt.

11. The device of claim 1, wherein the metal layer has a thickness between about 0.05 nm and about 10 nm.

12. The device of claim 1, wherein the metal layer is formed in a pattern on the amorphous silicon layer, and wherein first portions of the amorphous silicon layer are exposed and second portions of the amorphous silicon layer are covered by the metal later.

13. The device of claim 1, wherein the partially crystallized amorphous silicon layer is partially crystallized relative to crystallization of the polycrystalline silicon layer.

14. The device of claim 1, wherein an oxidation pressure during the first metal-induced crystallization is less than 5.0 atmospheric pressure.

15. The device of claim 1, wherein the second metal-induced crystallization was performed at a temperature of about 600° C. or less.

16. The device of claim 1, wherein the second metal-induced crystallization and the first metal-induced crystallization were performed at a substantially same temperature.

17. The device of claim 1, wherein the second metal-induced crystallization was performed at a higher temperature relative to the first metal-induced crystallization.

18. The device of claim 1, wherein the polycrystalline layer is exposed.

19. The device of claim 1, further comprising a dielectric layer formed on and adjacent to the polycrystalline silicon layer.

20. The device of claim 1, wherein the oxidizing ambiance comprises at least one of $O_2$, $H_2O$, or $N_2O$.

21. The device of claim 1, wherein the second metal-induced crystallization was performed for a duration that is variable between about 10 minutes to about 2 hours.

22. A device, comprising:
a polycrystalline silicon layer formed on a substrate and comprising a crystallized structure, wherein the polycrystalline silicon layer comprises crystal grains with silicon interstitials formed at boundaries between the crystal grains having resulted from a first metal-induced crystallization, in an oxidizing ambience, of a partially crystallized amorphous silicon layer formed on the substrate and comprising a partially reacted metal layer formed on the partially crystallized amorphous silicon layer and metal elements formed within the partially crystallized amorphous silicon layer, thereby transforming the partially crystallized amorphous silicon layer into the polycrystalline silicon layer, wherein the partially crystallized amorphous silicon layer comprises a partially crystallized structure relative to the crystallized structure of the polycrystalline silicon layer, and wherein the metal elements were formed within the partially crystallized amorphous silicon layer from a second metal-induced crystallization, in a non-oxidizing ambience, of an amorphous silicon layer formed on the substrate and comprising a metal layer formed on and contacting the amorphous silicon layer, thereby transforming the amorphous silicon layer into the partially crystallized amorphous silicon layer.

23. The device of claim 22, wherein an oxidation pressure during the first metal-induced crystallization is less than 5.0 atmospheric pressure.

24. The device of claim 22, wherein the second metal-induced crystallization was performed at a temperature of about 600° C. or less.

25. The device of claim 22, wherein the second metal-induced crystallization and the first metal-induced crystallization were performed at a substantially same temperature.

26. The device of claim 22, wherein the second metal-induced crystallization was performed at a higher temperature relative to the first metal-induced crystallization.

27. The device of claim 22, wherein the second metal-induced crystallization was performed before the first metal-induced crystallization, and wherein the second metal-induced crystallization was performed for a duration of one hour or less and the first metal-induced crystallization was performed for a duration of nine hours or more.

28. The device of claim 22, wherein the polycrystalline layer is exposed.

29. The device of claim 22, further comprising a dielectric layer formed on and adjacent to the polycrystalline silicon layer.

30. The device of claim 22, wherein the oxidizing ambiance comprises at least one of $O_2$, $H_2O$, or $N_2O$.

31. The device of claim 22, wherein the second metal-induced crystallization was performed for a duration that is variable between about 10 minutes to about 2 hours.

32. A device, comprising:
a polycrystalline silicon layer formed on a substrate,
wherein the polycrystalline silicon layer comprises crystal grains with silicon interstitials formed at boundaries between the crystal grains based on a first metal-induced crystallization, in a non-oxidizing ambience, of an amorphous silicon layer comprising a metal layer formed on and contacting the amorphous silicon layer, and further based on a second metal-induced crystallization of the amorphous silicon layer performed in an oxidizing ambiance after the first metal-induced crystallization.

33. The device of claim 32, wherein the polycrystalline silicon layer further comprises the crystal grains with the silicon interstitials formed at the boundaries between the crystal grains based on diffusion of metal elements from the metal layer into the amorphous silicon layer in response to the first-metal induced crystallization.

34. The device of claim 33, wherein the polycrystalline silicon layer further comprises the crystal grains with the silicon interstitials formed at the boundaries between the crystal grains based on crystallization, during the second metal-induced crystallization, of the amorphous silicon layer with the metal elements formed therein.

* * * * *